(12) United States Patent
Lafort

(10) Patent No.: US 6,353,344 B1
(45) Date of Patent: Mar. 5, 2002

(54) HIGH IMPEDANCE BIAS CIRCUIT

(75) Inventor: Adrianus M. Lafort, Delft (NL)

(73) Assignee: Microtronic US, Inc., Minnetonka, MN (US)

(*) Notice: Subject to any disclaimer, the term of this patent is extended or adjusted under 35 U.S.C. 154(b) by 0 days.

(21) Appl. No.: 09/577,730

(22) Filed: May 22, 2000

(51) Int. Cl.[7] .................................. H03B 1/00
(52) U.S. Cl. ....................... 327/108; 327/543
(58) Field of Search ......................... 327/108, 530, 327/538, 540, 541, 543, 545, 546; 330/277, 285, 296, 307

(56) References Cited

U.S. PATENT DOCUMENTS

| | | | |
|---|---|---|---|
| 5,446,413 A | 8/1995 | Loeppert et al. | 330/277 |
| 5,675,290 A | * 10/1997 | Tuskahara et al. | 330/277 |
| 6,107,893 A | * 8/2000 | Forbes | 331/36 L |

FOREIGN PATENT DOCUMENTS

EP 0880225 A2 4/1998 ............ H03F/1/56

WO WO 96/10291 4/1996 ............ H03F/3/185

OTHER PUBLICATIONS

"General Considerations of Noise in Microphone Preamplifiers," A.G.H. Van der Donk, J.A. Voorthuyzen and P. Bergveld, Sensors and Actuators A, 25–27 (1991), pp. 515–520.

"A Set of Four IC's in CMOS Technology for a Programmable Hearing Aid," Francois Callias, Francois H. Salchli, and Dominique Girard, IEEE Journal of Solid-State Circuits, vol. 24, No. 2, Apr. 1989, pp. 301–312.

* cited by examiner

Primary Examiner—Jeffrey Zweizig
(74) Attorney, Agent, or Firm—Daniel J. Burnham; Stephen G. Rudisill; Jenkens & Gilchrist

(57) ABSTRACT

A high input impedance circuit for a buffer amplifier of a hearing aid microphone includes a transistor coupled across an input of the buffer amplifier and providing a high impedance transconductance, and a control circuit operatively coupled with the transistor to control the effective value of the input impedance provided thereby.

13 Claims, 3 Drawing Sheets

HIGH IMPEDANCE BIAS CIRCUIT

BACKGROUND OF THE INVENTION

This specification describes, with references to the accompanying drawings, an improvement in a preamplifier circuit for a microphone component of a hearing aid.

Generally speaking, a hearing aid utilizes three basic components, a microphone, an amplifier and a receiver or loudspeaker component. Briefly, the microphone generally includes a transducer for converting incoming sound pressure levels to corresponding electrical signals. The amplifier amplifies these electrical signals to a desired level, and the receiver or loudspeaker component translates these amplified electrical signals to an acoustical sound output, or outgoing sound pressure level.

Generally, the microphone component includes a transducer such as an electret microphone, and a buffer amplifier or "preamplifier." Often, a CMOS amplifier component is used as the preamplifier. The input of this CMOS preamplifier must be biased to ground level. However, since the signal source in the electret microphone is typically a relatively small capacitor, the impedance of the preamplifier input should be relatively large, and preferably, as large as possible. Currently, bias resistor values of about 10 Gohms are utilized. For further noise reduction, this value might be increased up to 100 Gohms. However, these resistors cannot be implemented on ICs but must be made on a thick film hybrid. As an alternative to the resistors for the preamplifier input impedance, a pair of small diodes coupled in parallel but in opposite polarity are sometimes used. This permits a relatively large impedance value to be obtained, which value is strongly dependant upon process variations. However, the use of diodes for this purpose has the disadvantages of slow settling and slow overload recovery, which are characteristics of diodes.

OBJECTS AND SUMMARY OF THE INVENTION

Accordingly, it is an object of the invention to provide a high input impedance for a CMOS preamplifier which overcomes the above-noted shortcomings of utilizing bias resistors or reverse-polarized parallel diodes.

In accordance with the foregoing, a high input impedance circuit for a buffer amplifier/preamplifier of a hearing aid microphone comprises a transistor coupled across an input of said buffer amplifier/preamplifier and providing a high impedance transconductance, and a control circuit operatively coupled with the transistor to control the effective value of the input impedance provided thereby.

DETAILED DESCRIPTION OF THE DRAWINGS

The Prior Art

Figure 1:
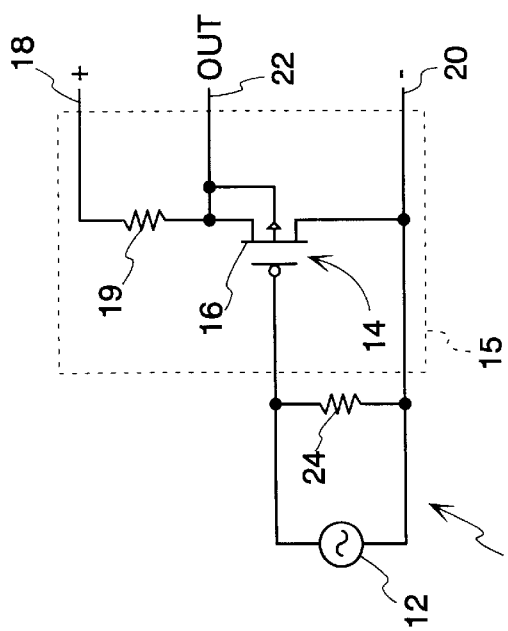
FIG. 1 is a schematic circuit diagram of a prior art microphone circuit for a hearing aid.

Referring initially to FIG. 1, a schematic circuit diagram of a microphone 10 for a hearing aid is designated generally by the reference numeral 10. The microphone includes a transducer component 12 such as an electret microphone which is symbolized in FIG. 1 as a current source. The microphone 10 also includes a buffer amplifier/preamplifier circuit portion 14 (hereinafter "preamplifier") which may comprise an MOS field effect transistor (FET) 16 wired in a common source configuration. A positive voltage 18 is provided with a suitable biasing resistor 19 for the transistor 16. A common or negative voltage connection 20 is also provided. The source electrode of the FET 16 provides the output 22 of the preamplifier 14. The preamplifier circuit 14 may be realized on a single integrated circuit (IC) chip 15.

The input of the preamplifier 14 for the microphone 10 must be biased to ground level. Since the signal source in the electret 12 is a very small capacitor, the impedance of the amplifier input must be as large as possible. Currently, a bias resistor 24 of about 10 Gohms is used. For reasons of noise reduction this value may be increased up to 100 Gohms. These resistors cannot be realized on IC's, therefore they are usually made on a thick film hybrid.

Figure 2:
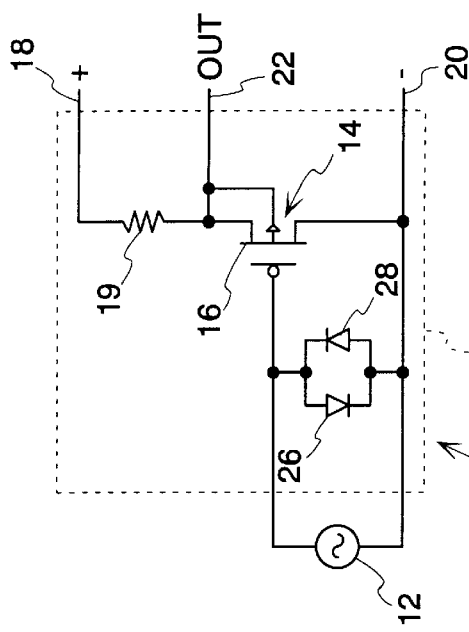
FIG. 2 is a schematic circuit diagram of an alternate form of prior art microphone circuit.

Referring to FIG. 2, a similar microphone 10 employing an electret transducer or microphone 12 and a preamplifier circuit 14, on an IC chip 15, is illustrated. Like reference numerals are utilized to designate like elements in FIG. 2.

In FIG. 2, the input impedance for the preamplifier 14 may be integrated onto the same chip 15 in the form of a pair of parallel diodes 26, 28 connected in reverse polarity. As indicated above, a relatively large impedance value can be obtained by the use of such diodes 26, 28, however, the value is strongly dependant on process variations. That is, it is difficult in the integrated circuit manufacture process to accurately predict the value of the impedance obtained by use of diodes 26, 28 within acceptable tolerance levels. The diodes 26, 28 also exhibit properties typical of diodes, in that they are relatively slow in settling or reaching steady state conditions, exhibit relatively slow overload recovery times, and the like.

The Invention

Figure 3:
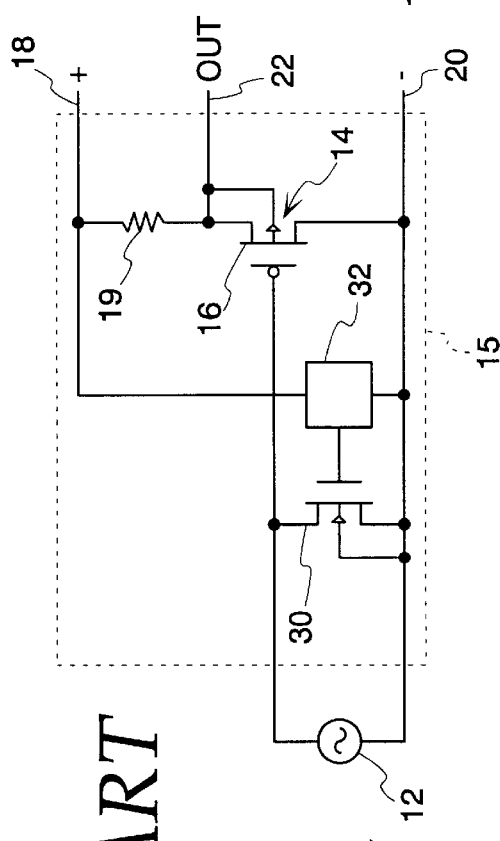
FIG. 3 is a schematic circuit diagram of a circuit for a hearing aid microphone in accordance with the present invention.

Referring to FIG. 3, like reference numerals are again utilized to designate like elements and components. In accordance with the invention, the input impedance in FIG. 3 is provided by an additional MOS transistor or MOSFET 30.

The MOSFET 30 is used as a high impedance transconductance, and a control circuit 32 is provided to control its effective impedance. The MOS transistor 30 and its control circuit 32 may be integrated onto the same chip 15 as the preamplifier circuit 14. The control circuit 32 generates a gate voltage for the MOSFET 30. The MOSFET 30 is designed so that the impedance is always higher than some selected minimum value, e.g. 50 Gohms, at the minimum control voltage. In this regard, the channel width of the MOSFEFT 30 may be about the minimum allowed by CMOS-IC technology, and the channel length about 10 times longer.

Figure 4:
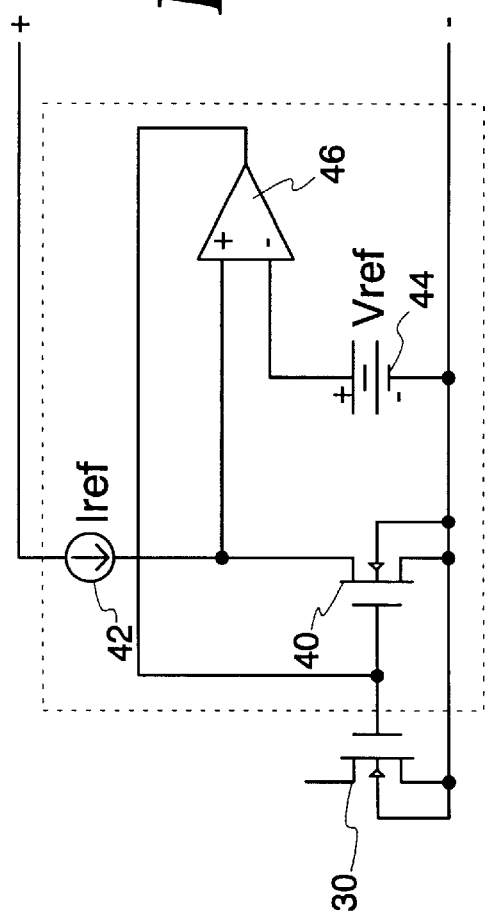
FIG. 4 is a schematic circuit diagram illustrating further details of the circuit of FIG. 3.

Referring to FIG. 4, further details of one embodiment of the control circuit 32 are shown. In FIG. 4, the control voltage is derived from a reference MOSFET 40, which is biased with a certain reference current Iref 42 (order of magnitude 1 pA) and associated voltage (typically 100–300 mV). Since this value of the reference current 42 is extremely small, the channel width of the reference MOSFET 40 (compared to MOSFET 30) and the reference current can be upscaled by a factor 100 to 1000 in order to achieve more practical values.

As shown in FIG. 4, the reference current 42 and the source electrode of the transistor 40 are coupled with one input of a difference amplifier 46, with a reference voltage (Vref) 44 forming the other input. The output of the difference amplifier 46 is fed to the gate electrodes of FETs 30 and 40.

Figure 5:
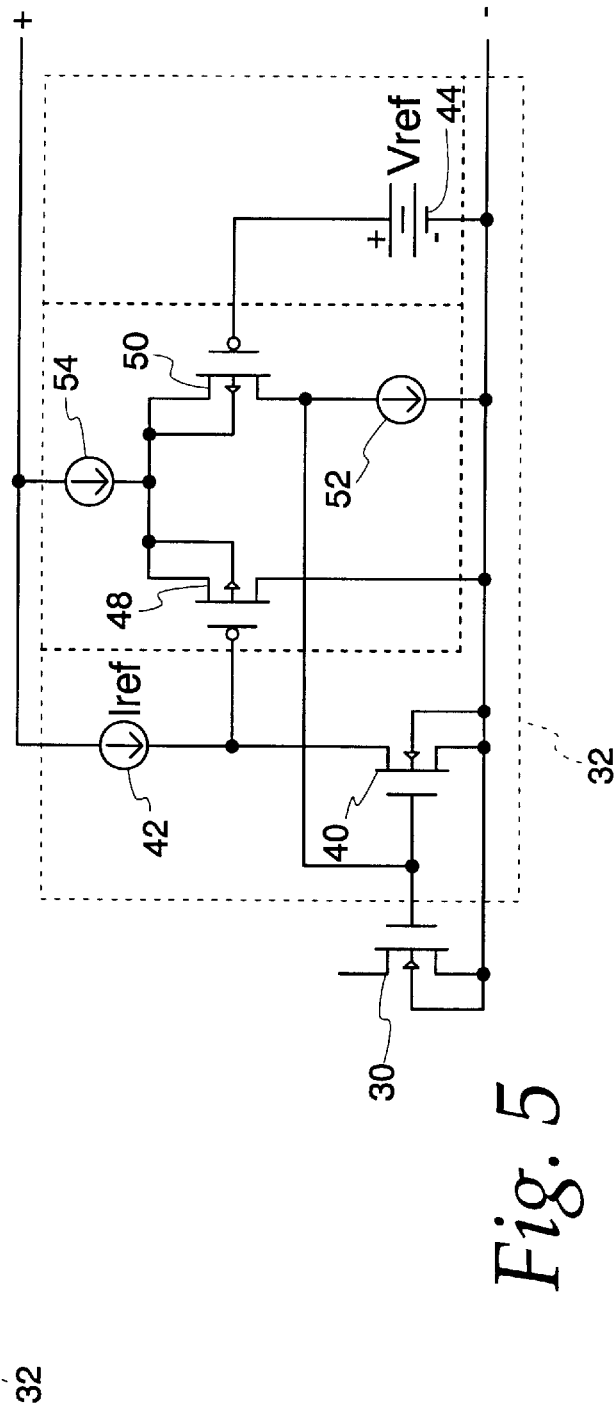
FIG. 5 is a schematic circuit diagram showing further details of the circuit of FIG. 4.

Referring to FIG. 5, the difference amplifier 46 may be implemented as a pair of MOSFETs 48, 50 provided with suitable bias currents 52 and 54. This implementation of the comparitor or difference amplifier 46 is capable of realization on the IC chip 15. Also, this implementation has the capability of driving the gate of the controlled transconductance FET 30 over a sufficiently large voltage range. The bias current 52(I) is less than 1 μA, and the bias current 54 is 2 times I.

Figure 6:
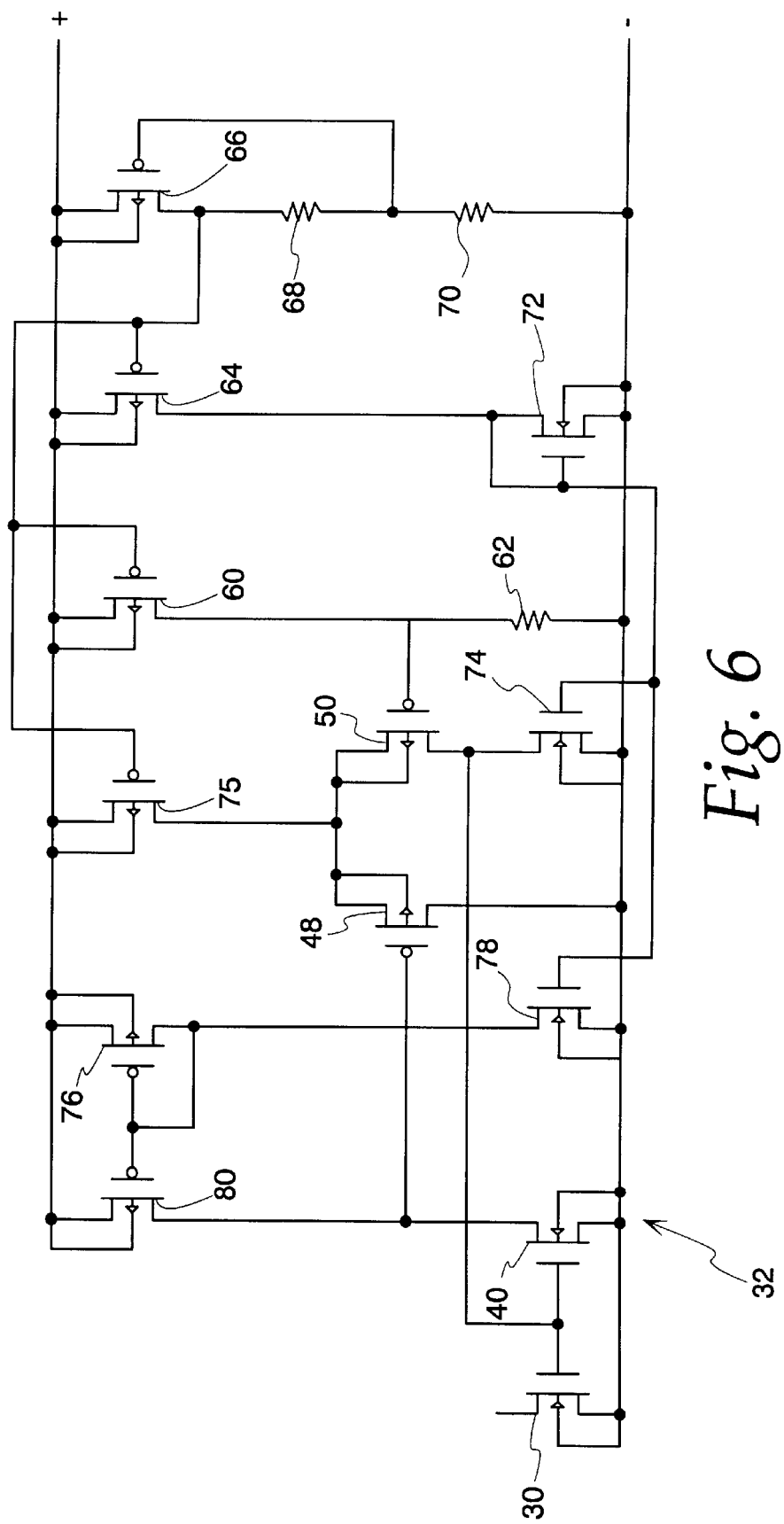
FIG. 6 is a schematic circuit diagram showing still further details of the circuits of FIGS. 3–5.

Referring to FIG. 6, like reference numerals are utilized to designate like elements and components to the previous figures of drawings. In FIG. 6, all of the components are realized as MOS components or as resistors which can be realized on the IC chip 15. The bias current sources 52 and 54 are provided by a bias current source circuit including transistors 64 and 66 and resistors (68 and 70. The reference voltage Vref (44) is provided by a transistor 60 and a resistor 62. Transistors 74 and 75 deliver the bias currents 52, 54 to the appropriate points of the difference amplifier comprising the transistors 48 and 50. The transistor 40 forms part of an attenuating current mirror circuit also including transistors 76 and 78 A transistor 80 provides the reference current Iref (42).

The circuit of FIG. 6 is designed for a 1 μA bias current (I) and a 100 mV reference voltage. This implementation is also designed for operating on supply voltage of from 0.9 to 2.5 V, with threshold voltage of 0.6±0.1 V, and has a typical current consumption of less than 6 μA.

The above-described high impedance bias circuit of the invention, as illustrated and described above with reference to FIGS. 3 through 6 offers a number of advantages over the prior art shown and described with reference to FIGS. 1 and 2. Among other things, the circuitry of the invention can be integrated onto a common chip 15 with the buffer amplifier/preamplifier circuitry 14. Unlike the diodes utilized in the embodiment of FIG. 2, the circuit of the invention is relatively insensitive to process variations in the IC manufacture process. The extremely high impedance which can be achieved by the circuitry of the invention minimizes the noise figure and optimizes signal to noise of the microphone component including the electret 12 and preamplifier 14. Also, the controlled impedance of the invention further limits and minimizes input settling time of the buffer amplifier circuitry 14.

The linearity of the bias device can be enhanced by adding a small capacitor (a few pF) between the source and gate of N-MOSFET 30.

While the present invention has been described with reference to one or more preferred embodiments, those skilled in the art will recognize that many changes may be made thereto without departing from the spirit and scope of the present invention which is set forth in the following claims.

What is claimed is:

1. A high input impedance circuit for a buffer amplifier/preamplifier of a hearing aid microphone said high input impedance circuit comprising:

a first transistor coupled across an input of said buffer amplifier and providing a high impedance transconductance, and a control circuit operatively coupled with said transistor to control the effective value of the input impedance provided thereby;

wherein said control circuit comprises a reference transistor coupled in circuit with said first transistor, said reference transistor being biased with a selected reference current, and a source of said reference current.

2. The circuit of claim 1 wherein said transistor and said control circuit are integrated on a single integrated circuit chip with said buffer amplifier/preamplifier.

3. The circuit of claim 1 wherein said control circuit further includes a difference amplifier coupled with said reference transistor and a source of a reference voltage for said difference amplifier.

4. The circuit of claim 3 wherein said reference transistor, said difference amplifier, said source of reference current, and said source of a reference voltage are integrated on a single integrated circuit chip with said buffer amplifier/preamplifier.

5. The circuit of claim 3 wherein said differential amplifier comprises a pair of transistors and a source of bias current for said pair of transistors.

6. The circuit of claim 5 wherein said reference transistor, said differential amplifier and said source of bias current are integrated on a single integrated circuit chip with said buffer amplifier/preamplifier.

7. The circuit of claim 5 wherein said transistor, said reference transistor and said pair of transistors comprising said difference amplifier, each comprise a MOS component, and are integrated on a single integrated circuit chip with said buffer amplifier/preamplifier.

8. The circuit of claim 7 wherein said source of reference current, said source of bias current, and said source of reference voltage comprise circuits constructed from MOS transistor and resistor components integrated on a single integrated circuit chip with said buffer amplifier/preamplifier, said transistor, said reference transistor and said differential amplifier.

9. A method of constructing high input impedance circuit for a buffer amplifier/preamplifier of a hearing aid microphone on a single integrated circuit chip with said buffer amplifier/preamplifier said method comprising:

forming on said integrated circuit chip a first transistor coupled across an input of said buffer amplifier/preamplifier and providing a high impedance transconductance, and forming on said integrated circuit chip a control circuit operatively coupled with said transistor to control the effective value of the input impedance provided thereby;

wherein said control circuit comprises a reference transistor coupled in circuit with said first transistor, said reference transistor being biased with a selected reference current, and a source of said reference current.

10. The method of claim 9 wherein said control circuit further includes a difference amplifier coupled with said reference transistor and a source of a reference voltage for said difference amplifier.

11. The method of claim 10 wherein said difference amplifier comprises a pair of transistors and a source of bias current for said pair of transistors.

12. The method of claim 11 wherein said transistor, said reference transistor and said pair of transistors comprising said difference amplifier, each comprise a MOS component.

13. The method of claim 12 wherein said source of reference current, said source of bias current, and said source of reference voltage comprise circuits constructed from MOS transistor and resistor components capable of being integrated on a single integrated circuit chip with said buffer amplifier/preamplifier, said transistor, said reference transistor and said differential amplifier.

* * * * *